(12) United States Patent
Zhu et al.

(10) Patent No.: US 7,961,770 B1
(45) Date of Patent: Jun. 14, 2011

(54) OPTOELECTRONIC MODULE WITH INTEGRATED MONITORING PHOTODIODE ARRAY FOR A PARALLEL OPTICAL TRANSMITTER

(75) Inventors: Daniel Zhu, Cupertino, CA (US); Jason O'Neil, Hayward, CA (US); Chuan Xie, San Jose, CA (US); Dennis Burke, Newark, CA (US); Jiaxi Kan, San Jose, CA (US); Gary Basey, Newark, CA (US)

(73) Assignee: Emcore Corporation, Albuquerque, NM (US)

( * ) Notice: Subject to any disclaimer, the term of this patent is extended or adjusted under 35 U.S.C. 154(b) by 0 days.

(21) Appl. No.: 12/726,165

(22) Filed: Mar. 17, 2010

(51) Int. Cl.
*H01S 5/00* (2006.01)

(52) U.S. Cl. . 372/50.21; 372/6; 372/50.12; 372/50.124; 372/101

(58) Field of Classification Search ........... 373/6, 50.12, 373/50.124, 50.21
See application file for complete search history.

(56) References Cited

U.S. PATENT DOCUMENTS

| | | | |
|---|---|---|---|
| 2002/0197025 A1* | 12/2002 | Vaganov et al. | 385/92 |
| 2008/0277571 A1* | 11/2008 | Sherrer et al. | 250/239 |
| 2010/0321880 A1* | 12/2010 | Yeo et al. | 361/679.46 |

* cited by examiner

*Primary Examiner* — Dung T Nguyen

(57) ABSTRACT

A power monitoring system uses a low loss reflective element to partially split the output laser beams from an array of laser sources, in a parallel configuration, to produce a monitor beams for each laser source. Each of these monitor beams may propagate within the reflective element in a lossless manner under total internal reflection and into one of a plurality of photodiodes that sense an optical characteristic such as output beam intensity, where this sensed signal is then used as part of a feedback control to control operation of the laser sources in the array.

20 Claims, 7 Drawing Sheets

US 7,961,770 B1

OPTOELECTRONIC MODULE WITH INTEGRATED MONITORING PHOTODIODE ARRAY FOR A PARALLEL OPTICAL TRANSMITTER

BACKGROUND OF THE DISCLOSURE

1. Field of the Disclosure

The disclosure relates generally to optical communications systems and parallel optical transmitters and, more particularly, to parallel optical transmitters having a power-monitoring module with a laser array, photodiode array and integrated lens assembly.

2. Brief Description of Related Technology

Communication systems continue to experience increased demand in the number of systems installed and in the amount of data such systems are called upon to transmit. Increased usage of the Internet and e-mail, as well as increased usage of mobile handsets and corporate intranets/extranets, have all resulted in dramatic increases in the amount of data throughput for communication systems. The bulk of this data traffic is routed through the optical networking infrastructure used by local and long-distance carriers, Internet service providers, and increasingly by companies building their own internal communications infrastructure.

Some communication systems transmit data through techniques that allow for simultaneous communication between users, typically using one of a variety of different types of optical transceivers. These optical transceivers commonly include an optical transmit portion that converts an electrical signal into a modulated light beam that is coupled to a first optical fiber, and a receive portion that receives an optical signal from a second optical fiber and converts it into an electrical signal. Other implementations employ one fiber for both optical signals, traveling in opposite directions.

Most recently, parallel optical transceivers have been developed where data is transmitted and received simultaneously over an array of optical fibers connected in parallel. These parallel optical transmitters offer more robust operation over other optical transceivers and may be used over longer distances, where there is a premium on avoiding crosstalk and other errors. A typical parallel optical transceiver consists of a vertical cavity surface emitter laser (VCSEL) array, and a PIN diode array. A parallel optical ribbon fiber is inserted into the optical transceiver, coupling to the VCSEL array or the PIN diode array.

For consistent operation, VCSEL lasers require constant or near constant monitoring of power levels, and in some cases in the monitoring of output channel wavelength. This is because VCSELs, as well as other laser sources, are susceptible to degradation of performance over a lifecycle (e.g., a reduction in optical power for a given drive current/voltage). VCSELs can also vary in performance, from device to device, although this is a lessened concern with VCSELs over other laser sources because VCSELs are generally considered easier to quality test post fabrication and less susceptible to design defects due to standard wafer, batch fabrication techniques used. In any event, these variables, and others, all contribute to the possibility that VCSEL operation will vary, either statically across an entire array as in the case of temperature dependence, or dynamically within an array as in the case of inter-channel optical power fluctuations.

To ensure acceptable VCSEL operation, power monitoring becomes integral to transmitter design of VCSELs. Typical power monitoring control is performed by measuring through the photodiodes the output of the VCSELs. While some laser sources can be designed to emit a monitoring beam separately from the main data beam, because VCSELs typically only emit light from one surface, any monitoring must be from the same output beam used for data communications.

Current attempts to monitor the power of VCSELS involve splitting off a portion of the modulated output light beam and measuring the portion through the photodiode array. While VCSELs performance can vary, so too can the performance of the photodiodes. Photodiodes are susceptible to varying operation under different environmental conditions, and they degrade with performance over time. This photodiode variability can be both linear and non-linear. In either case, the variability reduces the accuracy of the monitoring performed by these photodiodes.

There is a need for techniques that allow optical transceivers, optical transmitters, etc. to operate in a parallel optical module configuration while providing more accurate monitoring of laser conditions.

SUMMARY OF THE DISCLOSURE

In accordance with one aspect of the disclosure, an optoelectronic module comprises: a housing having a receptacle end for accepting a connector of an optical fiber assembly having a plurality of optical fibers; a VCSEL array mounted on a base within the housing, the VCSEL array having a plurality of VCSELs each for producing a modulated optical signal; a photodiode array mounted on the base within the housing, the photodiode array having (i) a plurality of optical signal monitoring photodiodes each for monitoring a performance metric of one of the VCSELs and (ii) a reference diode to monitor an operating characteristic of the VCSEL array; and a lens assembly mounted within the housing adjacent the base and configured to receive the modulated optical signals and convert each into a modulated output signal and a monitoring signal, wherein the lens assembly is configured to couple each of the modulated output signals into one of the plurality optical fibers when the optical fiber assembly is connected to the receptacle end, and wherein the lens assembly is configured to couple each of the monitoring signals to one of the monitoring photodiodes.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

Figure 1:
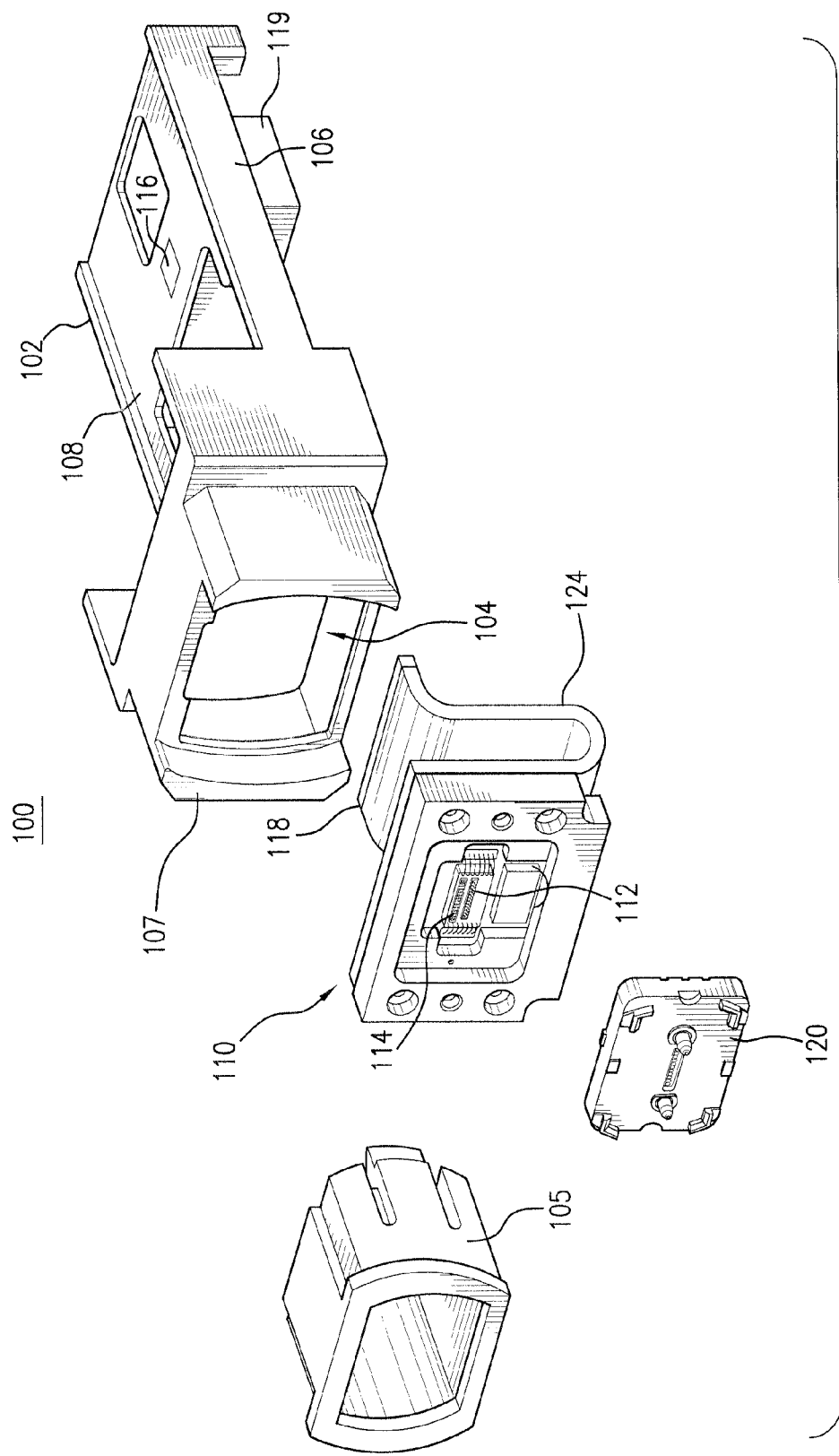
FIG. 1 illustrates an exploded view of a pluggable parallel optoelectronic module in accordance with an example.

While the disclosed methods and apparatus are susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION

Details of some example implementations of the invention will now be described. Referring to the drawings and the following description, like reference numbers are used to identify like or functionally similar elements, and are intended to illustrate major features of exemplary embodiments in a simplified diagrammatic manner. Moreover, the drawings are not intended to depict every feature of the actual embodiment nor the relative dimensions of the depicted elements, and are not drawn to scale.

FIG. 1 illustrates an optoelectronic module 100 that may be used as an optical transmitter, or transceiver, for communication over parallel optical data communication links, such as multi-mode fiber ribbon cable. The optoelectronic module 100 may be a pluggable device, for example, "hot pluggable" into a rack mounted line card network unit or chasses of a data system unit. Standard form factors set forth in Multiple Source Agreements (MSAs) provide standardized dimensions and input/output interfaces that allow devices from different manufacturers to be used interchangeably. Some of the more popular MSAs include XENPAK (see www.xenpak.org), X2 (see www.X2msa.org), SFF ("small form factor"), SFP ("small form factor pluggable"), XFP ("10 Gigabit Small Form Factor Pluggable", see www.XFPMSA.org), and the QSFP ("Quad Small Form-factor Pluggable," see www.QSFPMSA.org).

The optoelectronic module 100 has a 1×N configuration, where N=12 and represents the number of transmitting channels. While the module 100 is described as an optical transmitter, a similar module operating as an optical transceiver would have both transmit and receive channels.

The module 100 is described as operating with a VCSEL array, although other laser and light sources may be used. As a VCSEL array device, the module 100 preferably operates at channel wavelengths of between 750 to 980 nm, most preferably at channel wavelengths centered at or about 850 nm and using data rates of up to approximately 10 Gbps per channel.

The module 100 includes a pluggable housing 102 having a receptacle end 104 that is sized to accept a connector of an optical fiber assembly and a base end 106. The receptacle end 104 includes a fiber connector insert 105 that fits within a port 107 and is sized to allow an external optical fiber to be connected thereto using a standard connector, such as a ribbon fiber type MPO connector. Standard fiber ribbons meeting any of the industry standards, such as Telcordia or IEC standards, may be used. Furthermore, while the optoelectronic module 100 is preferably a 12 channel module, connecting with a 12 channel ribbon fiber, ribbons of any dimension 4, 6, 8, 12, 24, 36 or otherwise may be used depending on the size of the VCSEL array.

The base end 106 has a recess 108 that is configured to partially support a portion of a flex circuit board containing a laser/photodiode module 110 that includes a VCSEL array 112 and a photodiode array 114—the array 114 is described as a photodiode array for convenience sake, as it will be recognized that the reference diode in the array may not be a photodiode depending on different variations and configurations. Depending on the implementation, the base end 106 may also provide support for a rigid circuit board, a microprocessor 116 and/or PIN connector assembly 118 of a flex circuit board. In the illustrated example, the microprocessor 116 is a signal processing circuit coupled (e.g., via the PIN connector 118) to modulate the operation of the VCSELs and coupled to the photodiode array 114 for producing power adjustment signals for the VCSELs in the array 112. For example, the microprocessor 116 may be coupled to a reference diode (discussed below) that is used to normalize the measured intensity data from the monitoring photodiodes of array 114. The microprocessor 116 may use the normalized intensity data to determine set points for operating the VCSELs of the array 112, for example, where one or more VCSELs are operating at deflated or elevated output power levels. The microprocessor 116, for example, may set individual offset drive voltages for the VCSELs to compensate for changes in temperature operation, degradation over time, or other variable conditions.

The end 106 may be a thermally conductive substrate that supports an optional heat sink 119 opposite the circuit elements for temperature controlled operation. The housing 102 (as well as any outer casing or flex circuit capping plate) may be constructed of die-cast or milled metal, preferably die-cast zinc, although other materials also may be used, such as specialty plastics and the like. Preferably, the particular material used in the housing construction assists in reducing electromagnetic interference (EMI).

Disposed between the laser/photodiode module 110 and the MPO insert 105 is a lens assembly 120, which is mounted within the housing 102 and aligned to receive a modulated optical signal from the VCSELs 112 and convert a portion thereof into monitoring signals that the lens assembly 120 couples back to the photodiodes 114.

Figure 2:
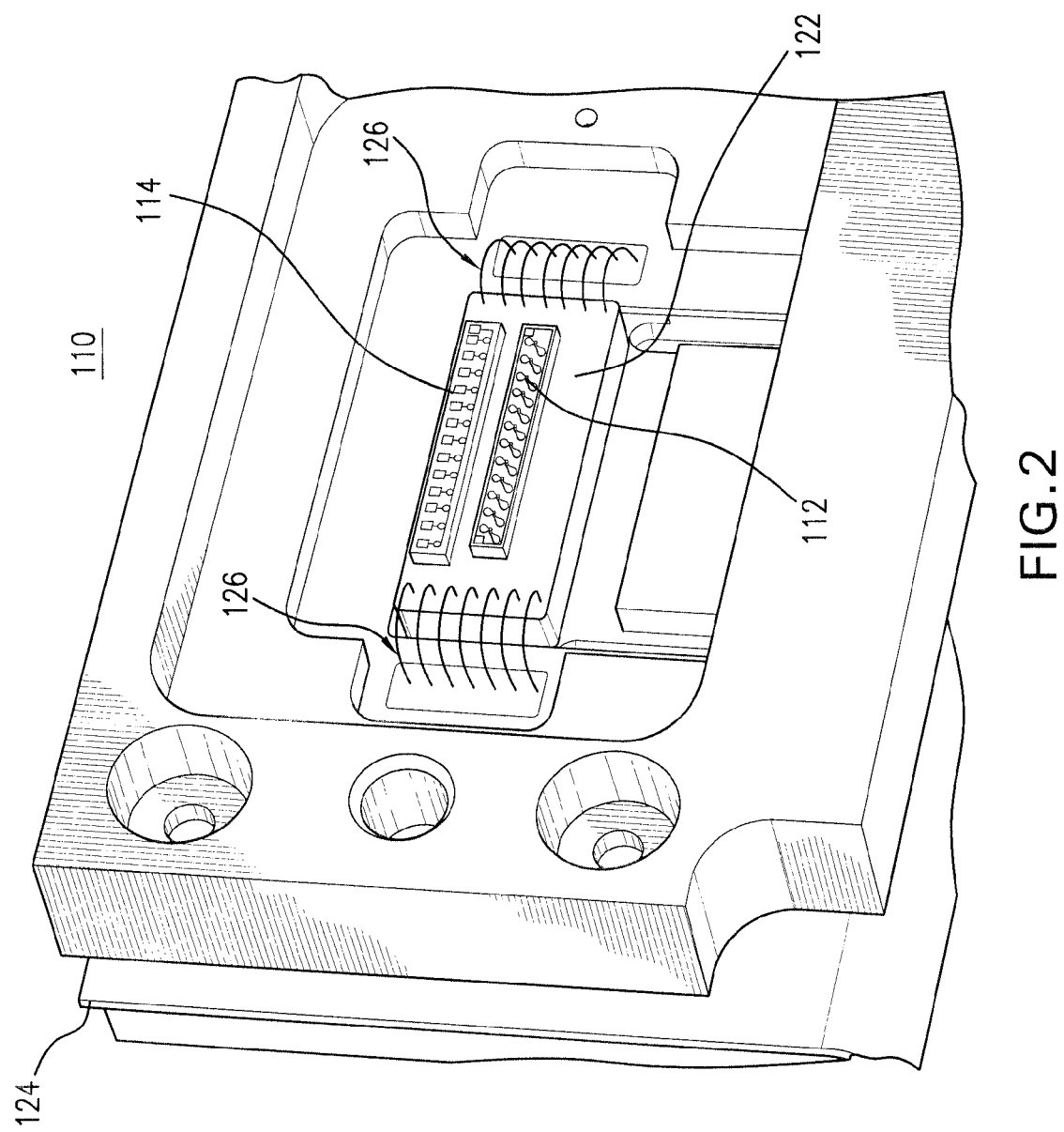
FIG. 2 is a perspective view of a flex circuit board having a laser array and photodiode array assembly in accordance with an example.

FIG. 2 provides a more detailed view of the laser photodiode module 110. The VCSEL array 112 and the photodiode array 114 are both attached to, and thermally coupled with, a heat sink plate 122 that is affixed to a flex circuit board 124. The support plate 122 may be a semiconductor support having electrical traces coupling each of the VCSELs in the array 112 and each of the photodiodes in the array 114 to wire bond leads 126 electrically coupled to the flex circuit board 124 and the PIN connector 118, which may be on a distal portion of the circuit board 124. In the illustrated example, the VCSEL array 112 has 12 VCSELs and the photodiode array has 13 photodiodes, some for monitoring optical signals from corresponding VCSELs, and one operating as a separate reference diode for monitoring an operating characteristic of the VCSEL array 12, such as the thermal temperature. While separately-fabricated lasers and photodiodes may be used, the VCSEL array 112 is preferably a single manufactured contiguous semiconductor array (a wafer formed array) or assembly of batch-fabricated VCSEL chips. The photodiode array 114 may be formed in a similar manner. Preferably, the two arrays 112, 114 are maintained in a sufficiently close proximity such that the thermal conditions of the latter are experienced by the former. In other implementations, for example, where there are multiple reference diodes, the diodes may be thermally coupled to fewer than all VCSELs. Furthermore, while the operating characteristic of the VCSELs is described as temperature, other characteristics may be used instead, in particular characteristics that are measurable from the measured output from monitoring photodiodes.

Figure 3:
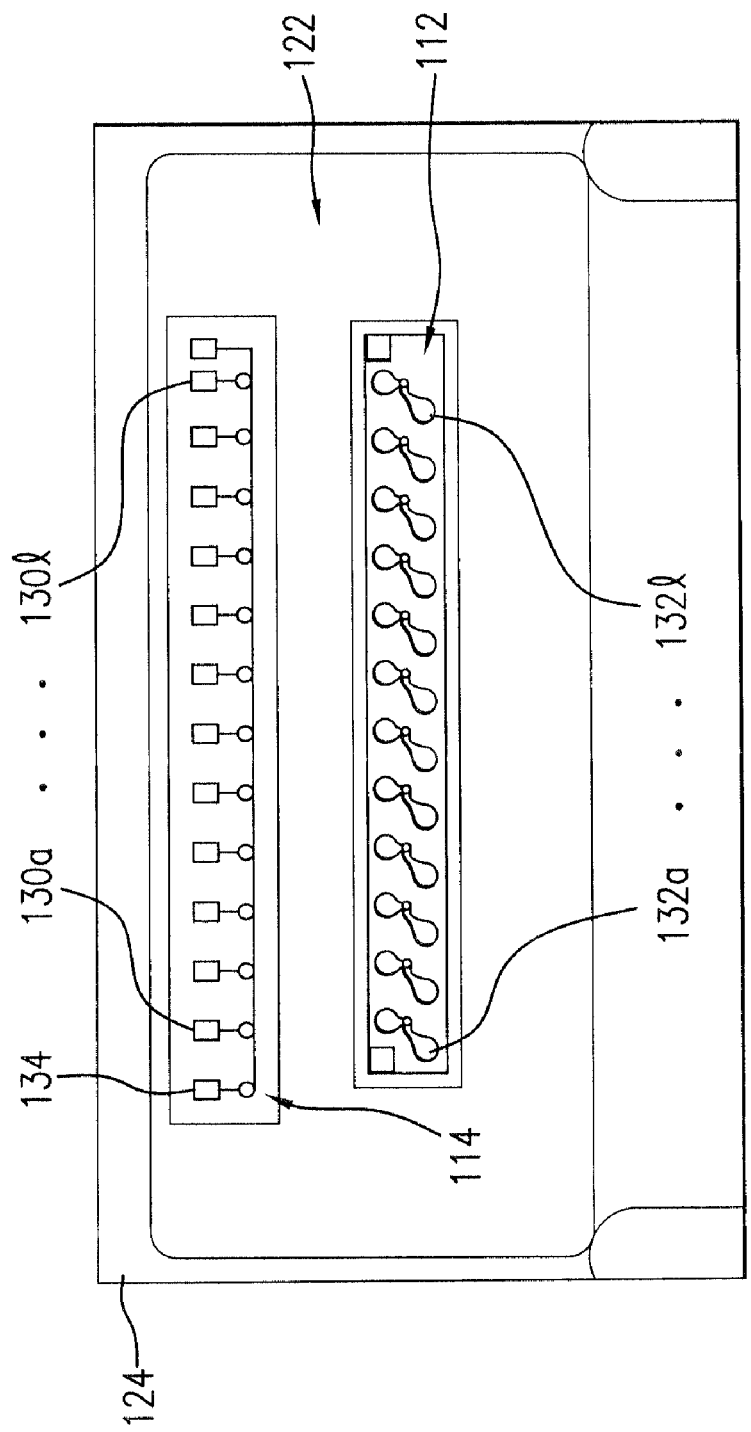
FIG. 3 is a front end view of the laser array and photodiode array of FIG. 2 and having a plurality of monitoring photodiodes and a separate dedicated reference diode.

FIG. 3 illustrates the VCSEL array 112 and photodiode array 114 of FIG. 2 mounted to the heat sink pedestal 122. As illustrated, each of the twelve photodiodes 130a-130l is (vertically) aligned with one of the 12 VCSELs 132a-132l, to monitor the modulated light beam therefrom. A separate reference diode 134 is in parallel with the signal monitoring photodiodes 130, in a common cathode configuration, such as discussed further in co-pending U.S. application Ser. No. 12/582,545, entitled "Power Monitoring Photodiode Array with Integrated, Current Sourced Reference Photodiode," the entire specification of which is expressly incorporated herein by reference. In a preferred example, the monitoring photodiodes 130 and the reference diode 134 are substantially identical to the one another in voltage-current characteristics. The monitoring elements 130 are photodiodes, while element 134 may be any suitable diode, photodiode or otherwise.

To keep the assembly 110 in a small package size able to more densely pack the VCSELs and photodiodes, the photodiode array 114 preferably is in an analog configuration and without dedicated pre-amplification (e.g., no trans-impedance amplifier) circuitry at each photodiode cell site. The VCSEL lasers 132 may produce output levels over a range from about 10 dBm to −30 dBm. The photodiodes 130 must be sensitive enough to measure a small, fixed percentage of that output beam to detect beam intensity. Although alternative configurations may be implemented, in the illustrated configuration the diodes 130 and 134 are in a common cathode configuration and substantially identical such that these diodes have the same or similar voltage response to the same dark current, at least over a range of operating temperature values. Essentially, it is desired that by measuring the voltage response of the reference diode 134 where that diode has been blocked from receiving incident light, an electrical characteristic (or performance) of the diode 134 may be measured, where the measured value also corresponds to that of the monitoring photodiodes 130, as well.

The diode 134 may be blocked from receiving incident light by depositing a metallized reflective layer over the photodiode or by using a shutter mechanism, either permanently blocking the photodiode or controllably blocking incident light through an active control.

The diode 134 may be in an open loop configuration in which the monitored voltage is supplied to a remote device or signal processor external to the device 100. While in other examples, the diode 134 is used in a closed loop control.

Figure 4:
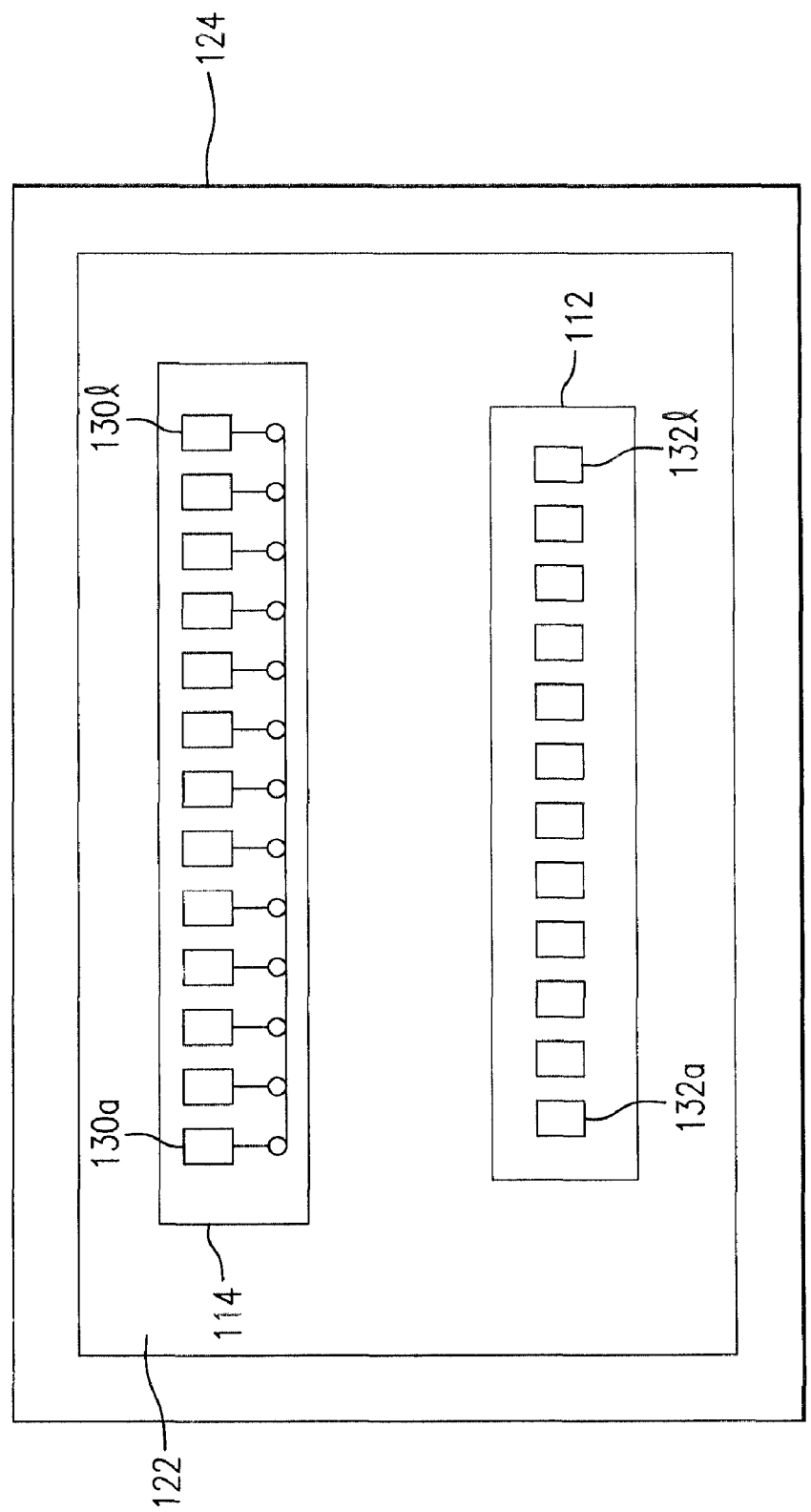
FIG. 4 is a front end view of another laser array and photodiode diode array configuration in which the reference diode is formed identical to the monitoring photodiodes on the same array.

FIG. 4 illustrates another example implementation in which the reference diode (134 in FIG. 3) is no longer a separate photodiode, but rather one of the monitoring photodiodes 130. In this example, an active shutter may be used to block incident light from hitting the entire array 114 during which time one or more of the photodiodes 130 is used as an reference diode.

In either example configurations of FIG. 3 or 4, in operation, the diode or diodes acting as reference diodes may be supplied different reference currents at different times, a low reference current $I_{low}$ and a high reference current $I_{high}$. These currents may be provided by a current-source enabled microprocessor supplying current to the reference diode 134, from which corresponding low and high reference voltages ($V_{low}$ and $V_{high}$) are measured, respectively. For example, these voltages may be measured by coupling the anode of the reference diode to an analog/digital controller (ADC) of the microprocessor.

To effectively compensate for temperature dependence in the voltage measured across monitoring photodiodes 130, a voltage-current relationship is determined. There are two temperature dependent parameters (namely, the slope and the intersect) that affect the measured voltage and its relationship to the received optical power (in dBm). Therefore, to properly calibrate the reference diode 134, the two voltages ($V_{LOW}$ and $V_{HIGH}$) must be determined under two respective, known forward bias currents ($I_{LOW}$ and $I_{HIGH}$). These values ($I_{HIGH}$, $I_{LOW}$, $V_{HIGH}$ and $V_{LOW}$) establish the calibration bounds for linear determination of optical power from the measured voltage of the monitoring photodiodes 134. Knowing $V_1$, $V_2$, $I_1$ and $I_2$, the received optical power (for any channel) can be calculated at any temperature without additional calibration.

While a common cathode configuration is described, in other configurations a common anode configuration may be used instead, as described in further detail in U.S. application Ser. No. 12/582,545, entitled "Power Monitoring Photodiode Array with Integrated, Current Sourced Reference Photodiode," incorporated by reference above.

Figure 5B:
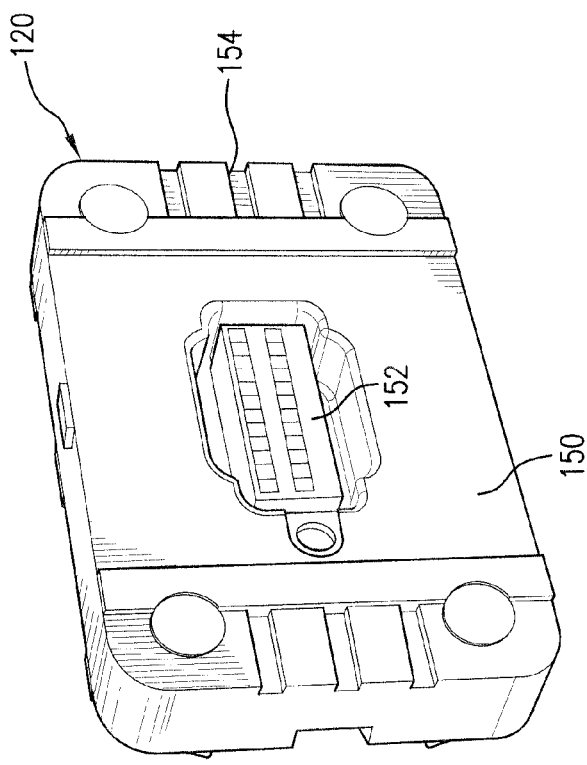
FIGS. 5A & 5B are perspective views of the front and rear faces of a lens assembly in accordance with an example.
Figure 5A:
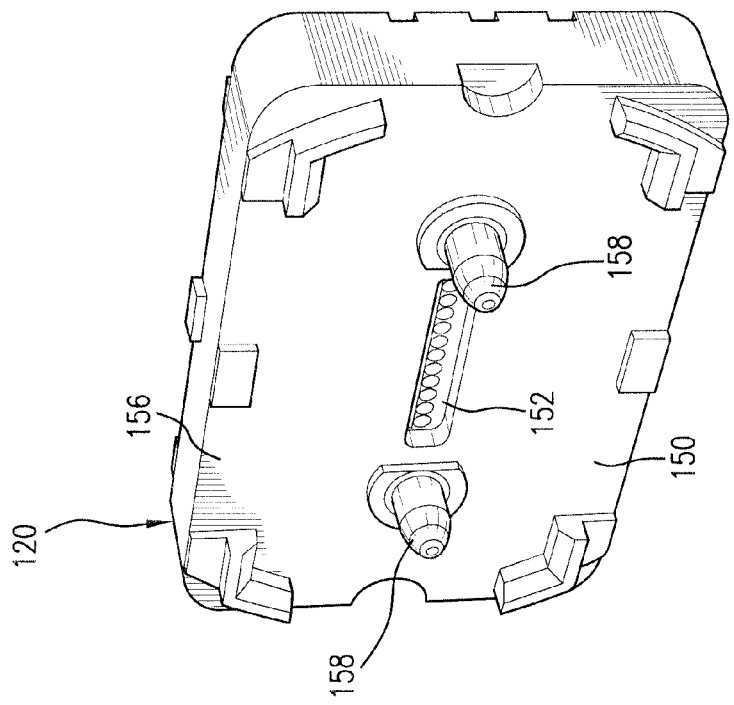
Figure 7:
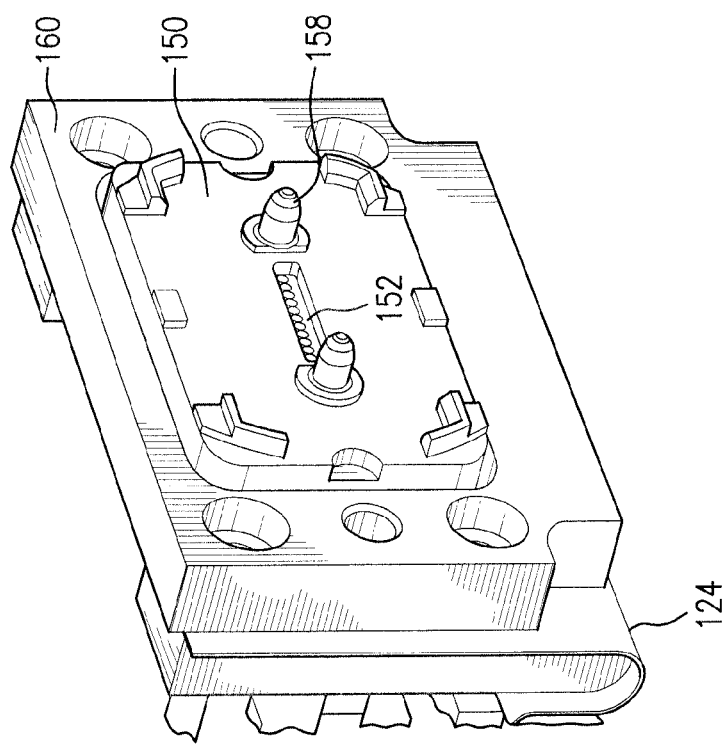
FIG. 7 is another perspective view of the power-monitoring module.
Figure 6:
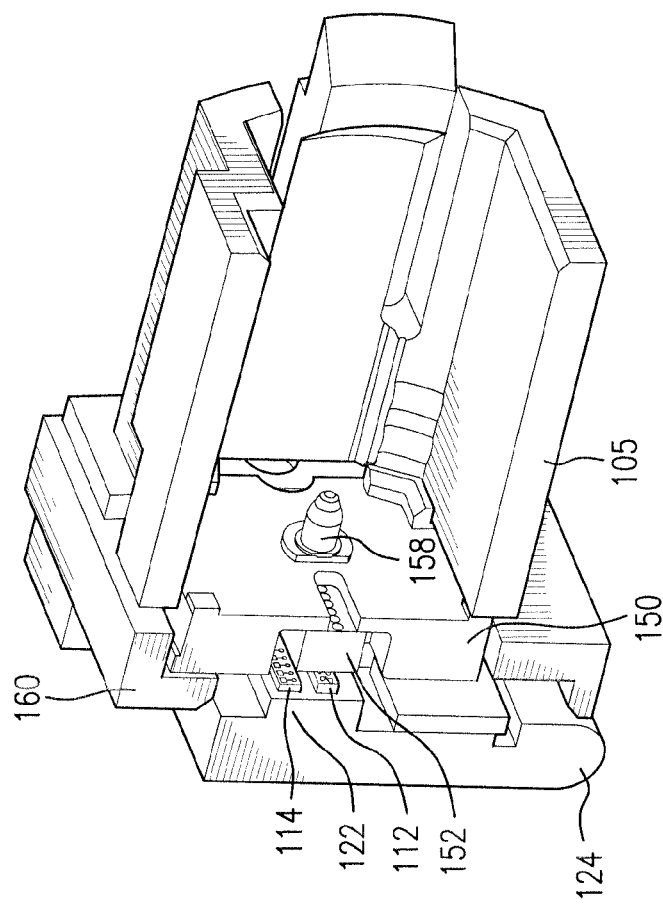
FIG. 6 illustrates a crossectional view of a power-monitoring module connected to a receptacle end of the optoelectronic module of FIG. 1.

FIGS. 5A and 5B illustrate the lens assembly 120 having a lens holder 150 and a lens array 152 having a plurality of lenses in an array configuration and aligned to couple modulated light beams from the VCSELs to fibers in a ribbon fiber assembly connected to insert 105. FIGS. 5A and 5B show the lens holder 150 from two sides 154, 156 each defining an opening. Side 156 is adjacent the fiber insert 105 and has integrated receptacles 158 for releasably engaging the connector of a ribbon fiber assembly, such as an MPO connector. The lens assembly 120 in this example is an integrated design, with ribbon fiber receptacles, thereby allowing the lens assembly to provide a pluggable backstop for the insert 105. Other lens holder configurations may be used, including ones attachable to a separate cap of the insert compatible with a U.S. connect MPO insert, for example. As illustrated in FIG. 6, the lens holder 150, which may be aluminum, is mounted in a recess of a spacer 160 such that the side 154 positions the lens array 152 adjacent the VCSELs 112 and photodiodes 114, where the spacer 160 mounts to the housing 102. FIG. 7 provides another illustration of the power-monitoring module assembled.

By mounting the lens assembly within a full or partial recess of a spacer element, the illustrated configuration is able to maintain the lens holder in place, even during repeated plugging and un-plugging of a ribbon fiber into the optical transmitter over it's lifetime. This integral design and using a flex circuit board with mounted VCSEL and photodiode array maintains a thinner profile that also allows for a more compact design, which also assists in keeping proper component alignment during operation. The design is further improved providing photodiode monitoring and correction of those photodiode measurements through the use of the reference diode that provides a signal or calibration data (I, V) for normalizing monitoring photodiode measurements. The design does not require individual circuit elements, such as trans-impedance amplifiers for each photodiode. Instead, the measured voltage from each photodiode may be provided to an external circuit in an open loop configuration.

Figure 8:
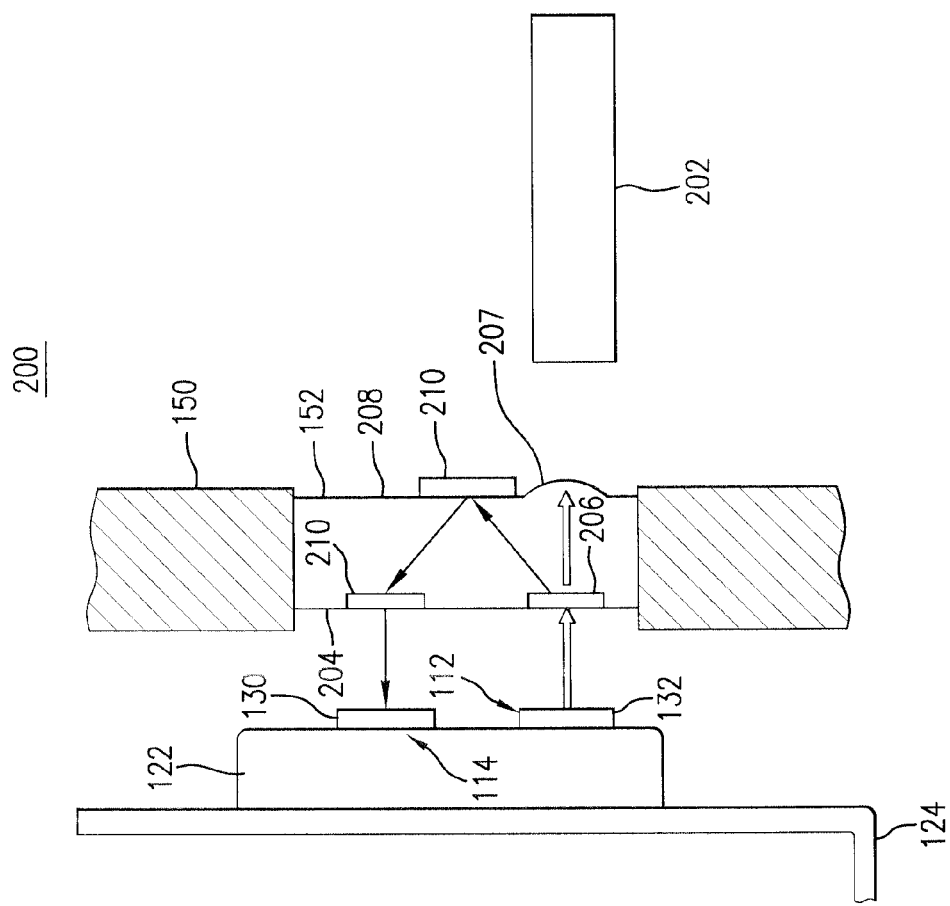
FIG. 8 is a side view of a power-monitoring module comprising a VCSEL array, photodiode array, and lens assembly.

FIG. 8 illustrates a power monitoring module 200 that may be used in the optoelectronic module 100, therefore where applicable like reference numbers are used. The module 200 is formed of the VCSEL array 112 and the photodiode array 114 both mounted to the heat sink pedestal 122. In this particular example, the monitoring lens array 152 is positioned adjacent to the VCSEL array 112 to receive a modulated optical signal from each VCSEL and convert that signal into a modulated output signal and a monitoring signal, where the latter is coupled to one of the optical signal monitoring photodiodes 130. The lens array 152 couples the modulated output signals to one of a plurality of optical fibers 202 forming a fiber ribbon array assembly.

The lens array 152 has a front face 204 onto which a first diffractive lens array 206 has been deposited for alignment with the VCSEL array 112. The lens array 206 preferably includes a separate diffractive lens for each VCSEL and aligned to coincide with the spacing of single- or multi-mode fibers in a standard ribbon fiber assembly. Each incident modulated optical beam is split by the lens array 206 into a corresponding modulated output signal and a monitoring signal. The modulated output signal beams are coupled to an array of refractive, convex lenses 207, disposed on a rear face 208 and aligned to couple the modulated output signals to the fibers 202. The lens 207, as with the other elements of the module 200, may be spaced apart for coupling into single- or multi-mode fibers in a standard fiber ribbon connector assembly.

The monitoring signals produced by the diffractive lens array 206 are coupled to a reflector element 210 on the rear face 208, which couples these signals to a second diffractive lens array 210 on the front face 204 and aligned to couple the monitoring signals to the photodiodes (130) of the array 114. The power monitoring system 200 may be used as part of a feedback control, where the optical signal monitoring photodiodes are operated in voltage mode in which each photodiode 130 provides a voltage indicating an intensity of an incident monitoring signal, where that intensity is proportional to operating laser power of a corresponding VCSEL. The monitored voltage signals for each photodiode 130 may be provided to the microprocessor 106 or in other examples directly to an external signal processing circuit to the module 100.

While a diffractive lens array 152 is illustrated, the array may be replaced with other types of beam splitter/coupling elements, including prism reflector beam splitters, fiber beam splitters, or facet beam splitters such as described in U.S. Ser. No. 12/426,743, entitled "Power Monitoring System for Parallel Optical Transmitter," the specification of which is hereby incorporated by reference in its entirety. An advantage of these types of reflectors is that, unlike diffractive optical elements which are fabricated to light-source dependent dimensions, these structures can be relatively wavelength independent. They may be used consistently across any desired optical communications wavelength, including for example, wavelengths in the ultraviolet, visible, near infrared, and far infrared spectral regions.

Embodiments of the subject matter and the functional operations described in this specification can be implemented in analog or digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Further modifications, substitutions, additions and/or rearrangements to the above described embodiments and falling within the spirit and/or scope of the underlying inventive concept will be apparent to the person skilled in the art to provide further embodiments of the invention, any and all of which are intended to be encompassed by the appended claims.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. An optoelectronic module comprising:
   a housing having a receptacle end for accepting a connector of an optical fiber assembly having a plurality of optical fibers;
   a VCSEL array mounted on a base within the housing, the VCSEL array having a plurality of VCSELs each for producing a modulated optical signal;
   a photodiode array mounted on the base within the housing, the photodiode array having (i) a plurality of optical signal monitoring photodiodes each for monitoring a performance metric of one of the VCSELs and (ii) a reference diode to monitor an operating characteristic of the VCSEL array; and
   a lens assembly mounted within the housing adjacent the base and configured to receive the modulated optical signals and convert each into a modulated output signal and a monitoring signal, wherein the lens assembly is configured to couple each of the modulated output signals into one of the plurality optical fibers when the optical fiber assembly is connected to the receptacle end, and wherein the lens assembly is configured to couple each of the monitoring signals to one of the monitoring photodiodes.

2. The optoelectronic module of claim 1, wherein there are N VCSELs and N optical signal monitoring photodiodes, where N is an integer greater than 1.

3. The optoelectronic module of claim 2, wherein N=12.

4. The optoelectronic module of claim 2, wherein the reference diode is one of the N optical signal monitoring photodiodes.

5. The optoelectronic module of claim 2, wherein the reference diode is separate from the N optical signal monitoring photodiodes.

6. The optoelectronic module of claim 1, wherein the lens assembly comprises a plurality of lens in an array configuration and each aligned to couple one of the modulated output signals to one of the optical fibers.

7. The optoelectronic module of claim 1, further comprising a lens holder having an integrated receptacle for releasably engaging the connector of the optical fiber assembly.

8. The optoelectronic module of claim 7, wherein the optical fiber assembly is a ribbon fiber assembly and the connector is a multi-fiber push on (MPO) connector, the integrated receptacle comprising connector extenders for engaging the MPO connector.

9. The optoelectronic module of claim 7, wherein the lens holder comprises aluminum.

10. The optoelectronic module of claim 1, wherein the lens assembly further comprises a first diffractive lens array for converting the modulated optical signals into the modulated output signals and the monitoring signals.

11. The optoelectronic module of claim 10, wherein the lens assembly further comprises a second diffractive lens array for coupling the monitoring signals into the optical signal monitoring photodiodes.

12. The optoelectronic module of claim 10, wherein the first diffractive lens array and the second diffractive lens array are deposited on the same surface of the lens assembly.

13. The optoelectronic module of claim 1, wherein the base is mounted to a flex circuit mounted within the housing, wherein the flex circuit provides heat sinking to the VCSEL array and the photodiode array during operation of the optoelectronic module.

14. The optoelectronic module of claim 1, wherein the operating characteristic of the VCSEL array is temperature.

15. The optoelectronic module of claim 1, further comprising a signal processing circuit mounted within the housing and coupled to the photodiode array for producing power adjustment signals for the VCSELs.

16. The optoelectronic module of claim 15, wherein the signal processing circuit is coupled to the reference diode for adjusting the power adjustment signals in response to changes in the operating characteristic of the VCSEL array.

17. The optoelectronic module of claim 1, wherein the reference diode is configured to produce reference voltages in response to respective reference currents supplied to the reference diode, where the reference diode and the monitoring photodiodes are in a common cathode configuration.

18. The optoelectronic module of claim 17, further comprising a signal processing circuit having an A/D converter directly connected to the anode of each of the monitoring photodiodes for measuring at each monitoring photodiode the voltage indicating the intensity during a monitoring mode, and for measuring the reference voltages of the reference diode during a reference update mode.

19. The optoelectronic module of claim 18, wherein the signal processing circuit is further configured to supply the reference currents to the reference diode during the reference update mode in an alternated manner.

20. The optoelectronic module of claim 17, wherein the reference voltages comprise high and low reference voltages that are produced in response to high and low reference currents, respectively.

* * * * *